United States Patent [19]

Yatabe

[11] Patent Number: 4,899,768
[45] Date of Patent: Feb. 13, 1990

[54] WAFER WASHING AND DRYING APPARATUS

[75] Inventor: Yasuo Yatabe, Tokyo, Japan

[73] Assignee: Tomco Mfg, Ltd., Tokyo, Japan

[21] Appl. No.: 289,833

[22] Filed: Dec. 27, 1988

[30] Foreign Application Priority Data

Dec. 28, 1987 [JP] Japan .......................... 62-197637[U]

[51] Int. Cl.$^4$ .............................................. B08B 3/10
[52] U.S. Cl. ....................................... 134/66; 134/76;
 134/107; 134/140
[58] Field of Search ................... 134/66, 76, 107, 135,
 134/82, 85, 92, 140, 164, 165

[56] References Cited

U.S. PATENT DOCUMENTS

| | | | |
|---|---|---|---|
| 3,106,927 | 10/1963 | Madwed ................................ | 134/76 |
| 4,282,825 | 8/1981 | Nagatomo et al. ............... | 134/66 X |
| 4,715,392 | 12/1987 | Abe et al. ........................... | 134/66 X |
| 4,722,752 | 2/1988 | Steck ................................. | 134/140 X |
| 4,736,758 | 4/1988 | Kusunara ............................. | 134/66 |
| 4,736,759 | 4/1988 | Coberly et al. ........................ | 134/66 |
| 4,777,970 | 10/1988 | Kusunara ............................. | 134/66 |

Primary Examiner—Frankie L. Stinson
Attorney, Agent, or Firm—Birch, Stewart, Kolasch & Birch

[57] ABSTRACT

A wafer washing and drying apparatus including a chemical cleaning bath for cleaning a wafer, such as a semiconductor wafer and a silicon wafer set in a carrier, with a liquid chemical reserved therein, a rinse bath for washing off the liquid chemical attached to the wafer with a washing liquid such as pure water or an organic solvent reserved therein, an organic vapor drier for drying the wafer in contact with a vapor flow of an organic solvent and a wafer holding device having a holder for holding the wafer only to be transferred from the carrier, which holder has a heat capacity smaller than that of the carrier, and which wafer holding device has a function of transporting the wafer from the rinse bath to the organic vapor drier and a wafer transferring device for transferring the wafer from the carrier to the holder in the rinse bath. After being washed by the washing liquid, the wafer can be quickly dried by the vapor of the organic solvent, thereby preventing the generation of stains or water marks on the wafer.

3 Claims, 5 Drawing Sheets

WAFER WASHING AND DRYING APPARATUS

BACKGROUND OF THE INVENTION

1. Field of the Invention

The present invention relates to an apparatus for washing a wafer such as a semiconductor wafer and a silicon wafer with a given washing liquid and thereafter drying the wafer with a vapor or organic solvent.

2. Description of the Prior Art

In the manufacturing of semiconductor devices, electronic parts, etc., a wafer such as a semiconductor wafer and a silicon wafer is surface-treated, and is then cleaned by a liquid chemical, such as an acid or alkali. Thereafter, the wafer is washed by a washing liquid, such as a pure water or organic solvent, and it is then dried by a vapor of organic solvent.

In the conventional wafer washing and drying step, the wafer is charged in a carrier, and is dipped in the liquid chemical reserved in the chemical cleaning bath. Then, the wafer charged in the carrier is transported by a transporter to a rinse bath reserving pure water or the like therein, and the liquid chemical deposited on the wafer is washed off. Next, the wafer with the carrier is transported to an organic vapor drier reserving an organic solvent and provided with a cooling pipe for preventing escape of the vapor of the organic solvent when heated. In the organic vapor drier, the washing liquid or the like attached on the wafer is replaced by the vapor of the organic solvent or removed by a buoyancy of the vapor, thus drying the wafer.

However, in the conventional wafer washing and drying apparatus, when the wafer charged in the carrier is dried by the vapor of the organic solvent in a space between the organic solvent and the cooling pipe in the organic vapor drier, the vapor of the organic solvent is cooled by the carrier having a heat capacity greater than that of the wafer, and the vapor is condensed to be liquefied. As a result, the wafer cannot be quickly dried which causes the generation of stains or water marks on the wafer. Further, the quantity of the organic solvent to be consumed is increased to cause problems with respect to economic and safety considerations. Further, the energy consumption of a heater for heating the organic solvent in the vapor drier is also increased. Additionally, when the carrier carrying the wafer is dipped in the chemical cleaning bath, the liquid chemical is deposited onto or penetrates into the carrier. As a result, when the wafer is dried in the organic vapor drier, the liquid chemical is vaporized to be attached onto the wafer, causing the generation of stains or water marks on the wafer. Thus, the wafer is rendered defective as a product.

SUMMARY OF THE INVENTION

The present invention has been developed to solve the above problems of the prior art, and it is an object of the present invention to provide a wafer washing and drying apparatus which may quickly dry the wafer with a vapor of organic solvent in the vapor drier, reduce the quantity of the organic solvent to be consumed, reduce the energy consumption of the heater in the vapor drier and prevent the liquid chemical deposited onto or penetrated into the carrier from being attached to the wafer.

According to the present invention, there is provided a wafer washing and drying apparatus including a chemical cleaning bath for cleaning a wafer set in a carrier with a liquid chemical reserved therein, a rinse bath for washing off the liquid chemical attached to the wafer with a washing liquid reserved therein, and an organic vapor drier for drying the wafer in contact with a vapor flow of an organic solvent, the improvement comprising a wafer holding device having a holder for holding the wafer to be transferred from the carrier, the holder having a heat capacity smaller than that of the carrier, the wafer holding device having a function of transporting the wafer from the rinse bath to the organic vapor drier, and a wafer transferring means for transferring the wafer from the carrier to the holder in the rinse bath.

In the wafer washing and drying apparatus of the present invention, the wafer is transferred from the carrier to the holder of the wafer holding device in the rinse bath. Under the condition where the wafer is held by the holder having a heat capacity smaller than that of the carrier, the wafer is dried with the vapor of the organic solvent in the organic vapor drier. Therefore, the wafer may be quickly dried without using the carrier having a large heat capacity.

Other objects and features of the invention will be more fully understood from the following detailed description and appended claims when taken with the accompanying drawings.

DETAILED DESCRIPTION OF THE INVENTION

Figure 1:
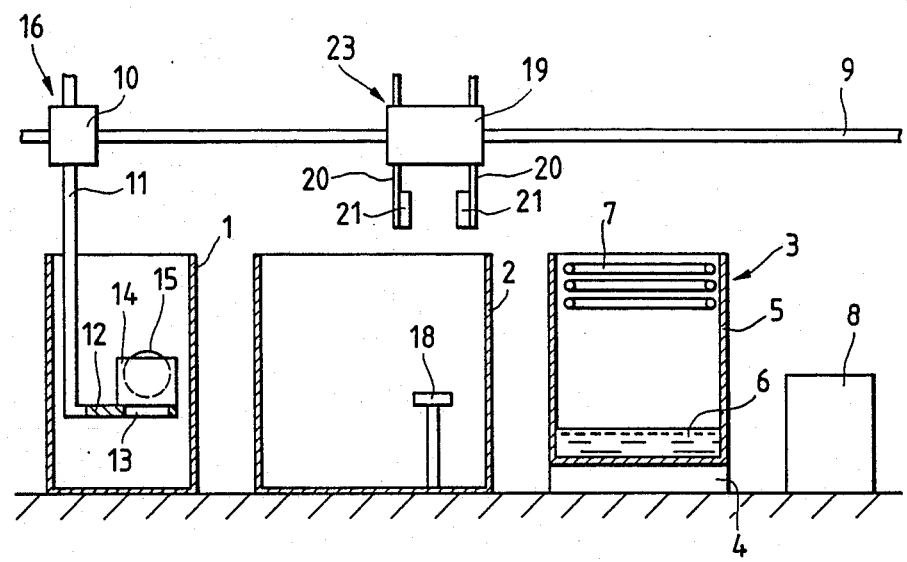
FIG. 1 is a schematic illustration of the wafer washing and drying apparatus of a preferred embodiment according to the present invention.

First, there will be described the construction of the wafer washing and drying apparatus of the prior art and the problem thereof with reference to FIGS. 10 to 13.

Referring to FIGS. 10 to 13, the wafer washing and drying apparatus includes a chemical cleaning bath 1, a rinse bath 2, an organic vapor drier 3, a heater 4 for the organic vapor drier 3, a drying bath 5 for the organic vapor drier 3, an organic solvent 6, such as isopropyl alcohol, reserved in the drying bath 5, a cooling pipe 7 provided at an upper portion in the drying bath 5, a carrier table 8 for mounting thereon a carrier charged with wafers after being dried, a guide 9 provided over the chemical cleaning bath 1, the rinse bath 2 and the organic vapor drier 3, a lift 10 horizontally movably mounted to the guide 9, a lift arm 11 vertically movably mounted to the lift 10, a carrier mounting member 12 provided at a lower portion of the lift arm 11, and a hole 13 formed through the carrier mounting member 12. The lift 10, the lift arm 11 and the carrier mounting member 12 constitute a transporter 16. Reference numeral 14 designates a carrier made of resin, glass or metal. The carrier 14 is formed with a plurality of slits 17 for receiving wafers 15 therein.

In operation of the prior art wafer washing and drying apparatus as constructed above, the wafers 15 are charged in the carrier 14, and the carrier 14 is placed on the carrier mounting member 12. Under this condition, the wafers 15 are dipped in the chemical cleaning bath 1, and are cleaned by acid or alkali reserved in the chemical cleaning bath 1. Then, the wafers 15 are transported into the rinse bath 2 by the transporter 16, and are washed by pure water or the like in the rinse bath 2. Next, the wafers 15 are further transported by the transporter 16 into the organic vapor drier 3 between the organic solvent 6 and the cooling pipe 7, and are dried by vapor of the organic solvent 6 in the organic vapor drier 3. That is, the organic solvent 6 is heated to a temperature not less than the boiling point thereof by the heater 4, and is vaporized. At the same time, cooling water is supplied to the cooling pipe 4 to prevent escape of the vapor of the organic solvent 6 out of the organic vapor drier 3. Under this condition, when the wafers 15 are transported between the organic solvent 6 and the cooling pipe 7, a liquid deposited on the wafers 15 is replaced by the vapor of the organic solvent 6 or removed by the buoyancy of the vapor. Then, the carrier 14 is further transported to a position over the carrier table 8 by the transporter 16, and is then placed onto the carrier table 8.

In the drying step by the vapor of the organic solvent 6 as mentioned above, the wafers 15 are dried under the condition where they are charged in the carrier 14. However, as the carrier 14 has a large heat capacity, the vapor of the organic solvent 6 is cooled by the carrier 14 when the wafers 15 are dried in the organic vapor drier 3. As a result, the wafers 15 cannot be quickly dried by the vapor of the organic solvent 6, causing the generation of a stain, such as a water mark. Further, quantity of the organic solvent 6 to be consumed is increased resulting in an uneconomical system and increased safety problems. Furthermore, energy consumption of the heater 4 is also increased to having a negative effect on the economics of the system. In addition, when the carrier 14 is dipped in the acid or alkali in the chemical cleaning bath 1, the liquid chemical is deposited on or penetrated into the carrier 14. As a result, when the carrier 14 is heated in the organic vapor drier 3, the liquid chemical deposited on or penetrated into the carrier 14 is attached to the wafers 15, causing the generation of a stain, such as a water mark.

Next, there will be described a preferred embodiment of the present invention with reference to FIGS. 1 to 9.

Figure 2:
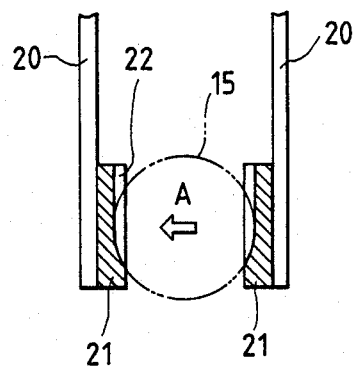
FIG. 2 is a sectional view of the essential part of the wafer washing and drying apparatus shown in FIG. 1.
Figure 3:
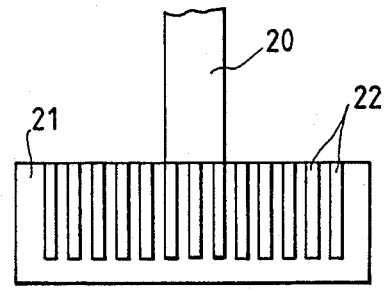
FIG. 3 is a side view as viewed in the direction of arrow A in FIG. 2.

Referring to FIGS. 1 to 3, reference numeral 23 generally designates a wafer holding device 23 comprising a moving member 19 horizontally movably mounted to the guide 9, a pair of holder arms 20 vertically movable and adjustably mounted to the moving member 19, and a pair of holders 21 mounted at opposing lower ends of the holder arms 20. A push-up table 18 is provided in the rinse bath 2. The holders 21 have a heat capacity smaller than that of the carrier 14. Each holder 21 is formed with a plurality of slits 22 for receiving the wafers 15 therein.

Figure 4:
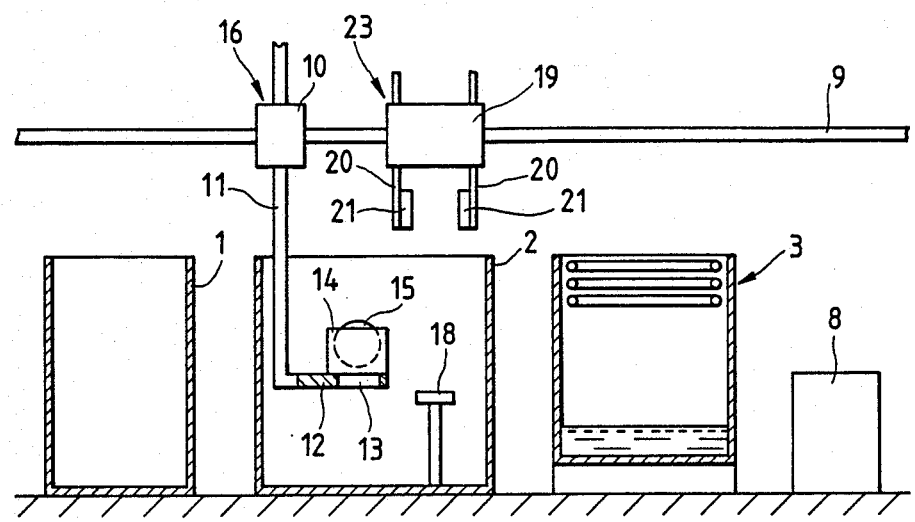
FIGS. 4 to 9 are schematic illustrations of the operation of the wafer washing and drying apparatus shown in FIG. 1.
Figure 5:
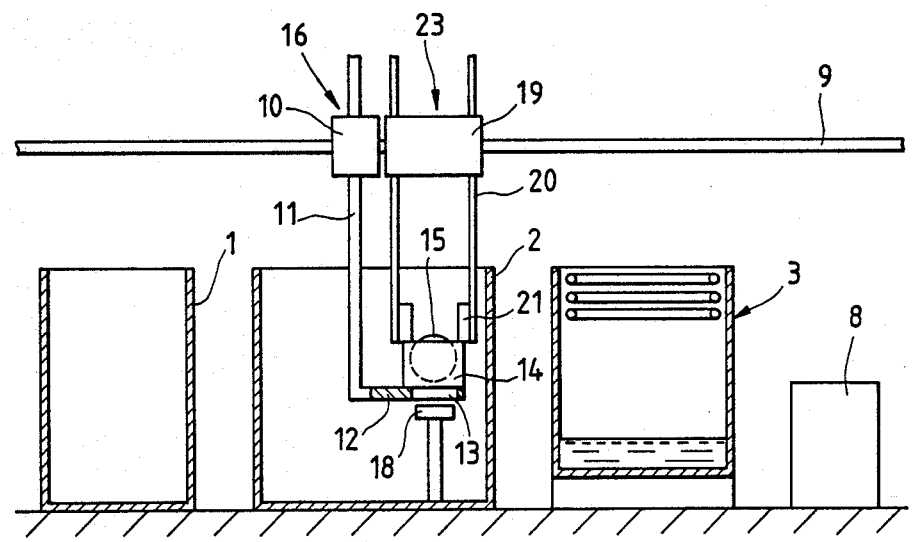
Figure 6:
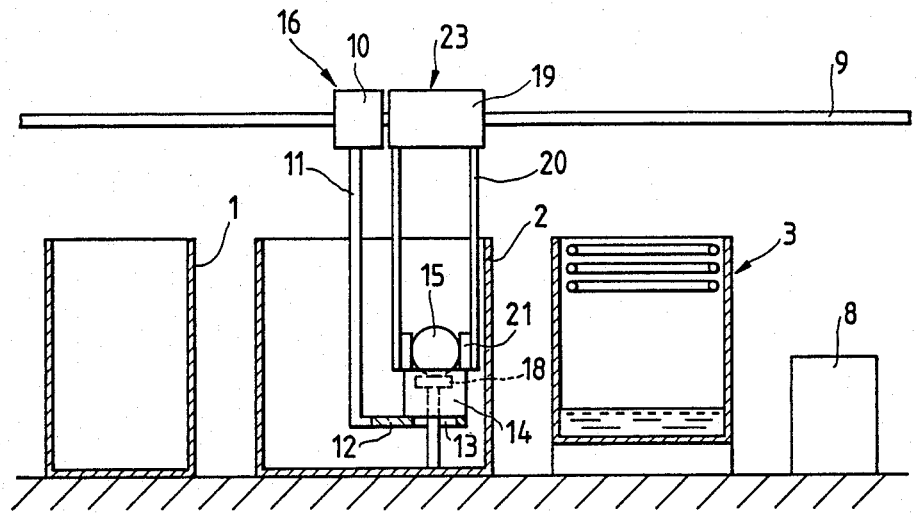
Figure 7:
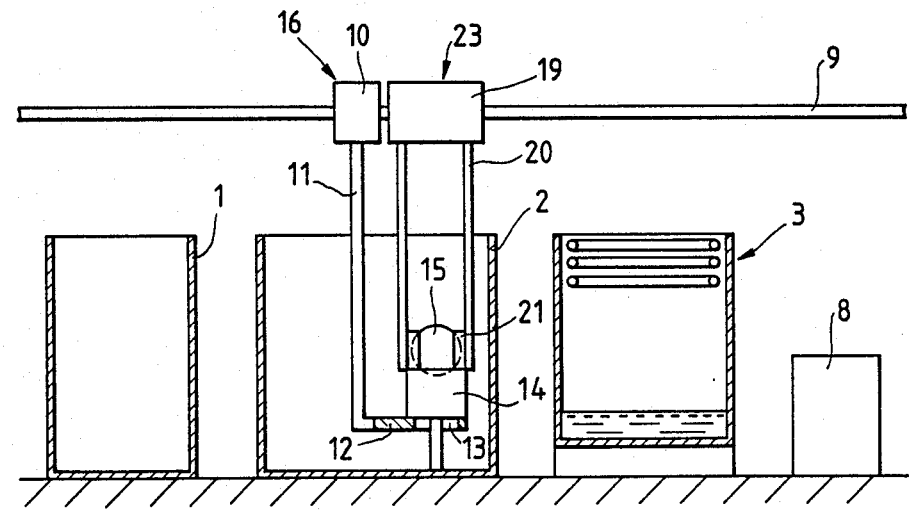
Figure 8:
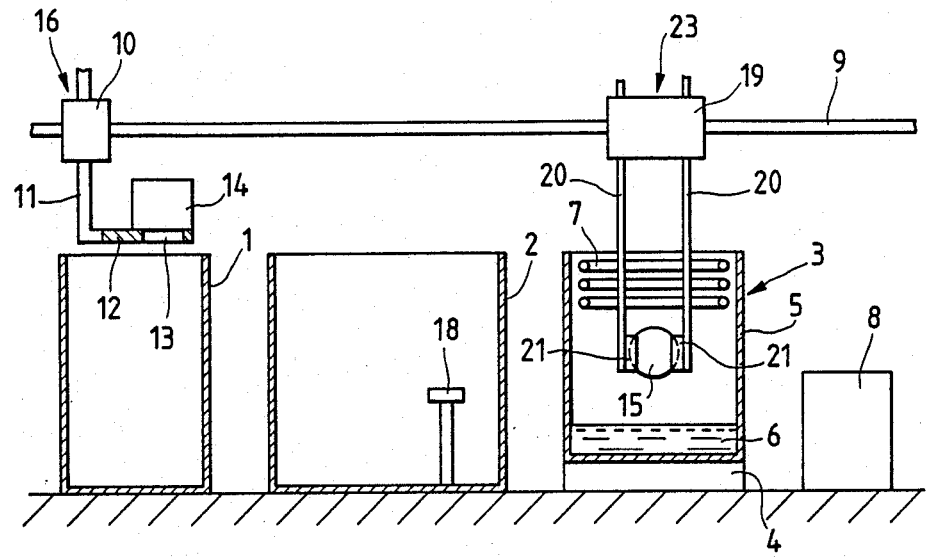
Figure 9:
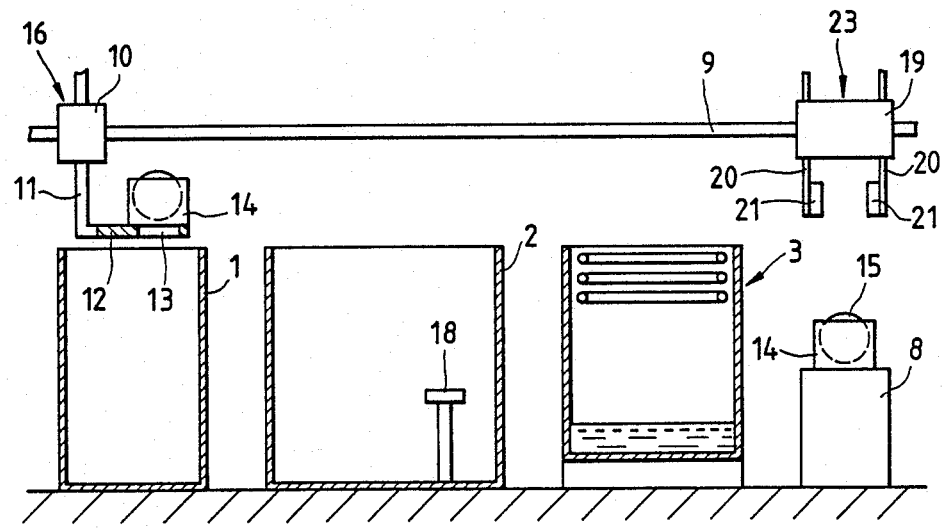
Figure 10:
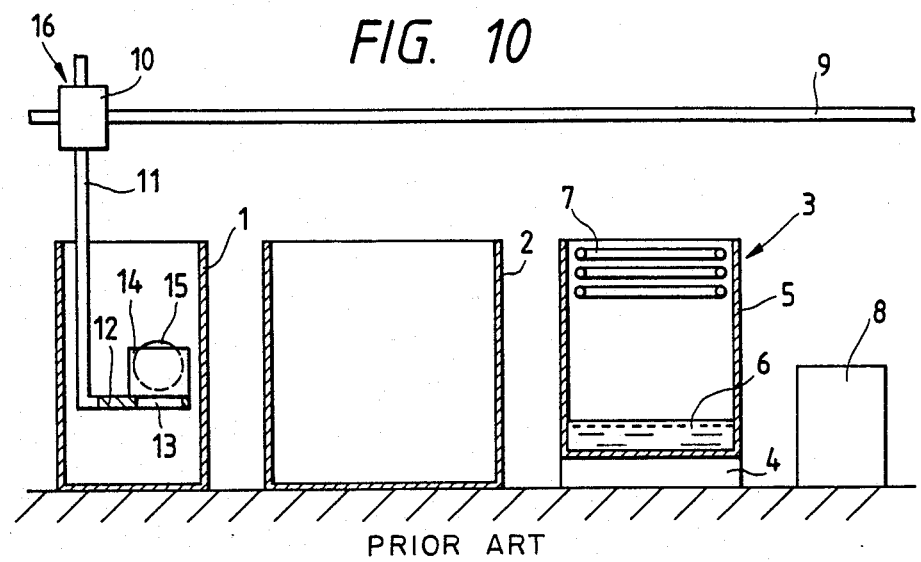
FIG. 10 is a schematic illustration of a conventional wafer washing and drying apparatus.
Figure 11:
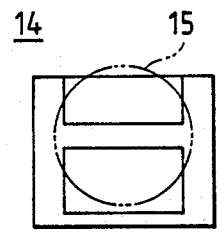
FIG. 11 is an elevational view of the carrier employed in the wafer washing and drying apparatus shown in FIG. 10.
Figure 12:
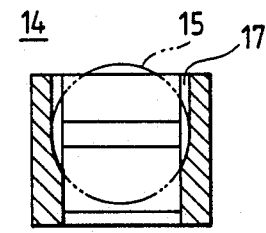
FIG. 12 is a sectional view in elevation of the carrier.
Figure 13:
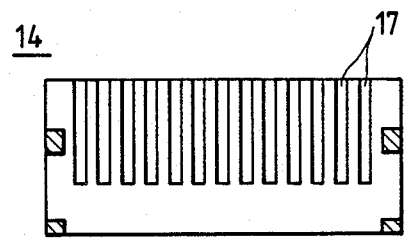
FIG. 13 is a sectional view inside of the carrier.

In operation, the wafers 15 set in the carrier 14 are dipped in the chemical cleaning bath 1, and are cleaned by an acid or alkali reserved in the chemical cleaning bath 1. Then, as shown in FIG. 4, the wafers 15 are transported into the rinse bath 2 by the transporter 16, and are washed by pure water or the like reserved in the rinse bath 2. Next, as shown in FIG. 5, the wafers 15 are moved to a position above the push-up table 18 by the transporter 16. At the same time, the holders 21 are lowered until the lower ends of the holders 21 come into contact with the upper end of the carrier 14. Then, as shown in FIG. 6, the holders 21 and the carrier 14 are lowered together. As a result, only the wafers 15 are pushed up by the push-up table 18. Then, as shown in FIG. 7, the holders 21 are closed by the holder arms 20 to hold the wafers 15. Next, as shown in FIG. 8, the wafers 15, held by the holders 21, are transported by the wafer holding device 23 into the organic vapor drier 3 between the organic solvent 6 and the cooling pipe 7, and are dried in the organic vapor drier 3 under the condition where they are held by the holders 21 having a small heat capacity. Then, as shown in FIG. 9, the wafers 15 are further transported by the wafer holding device 23 to a position over another carrier 14 not contaminated by chemicals, mounted on the carrier table 8, and are set into the carrier 14.

As described above, the wafers 15 are dried by the vapor of the organic solvent 6 under the condition where they are held by the holders 21 of the wafer holding device 23. That is, the wafers 15 are dried without using the carrier 14. Since the heat capacity of each holder 21 is smaller than that of the carrier 14, the vapor of the organic solvent 6 is barely cooled by the holders 21 when the wafers 15 are dried between the organic solvent and the cooling pipe 7 in the organic vapor drier 3. Accordingly, the wafers 15 can be quickly dried by the vapor thereby avoiding the generation of stains such as water marks. Further, the quantity of the organic solvent 6 to be consumed can be reduced to thereby improve the economy and ensure the safety. Further, energy consumption of the heater 4 can be also reduced to thereby improve the economy. Even when the liquid chemical in the cleaning bath 1 is deposited onto or penetrates into the carrier 14, the liquid chemical is prevented from attaching to the wafers 15 during the drying step, thereby avoiding the generation of water marks or the like on the wafers 15. Furthermore, as the wafers 15 are transported from the carrier 14 to the holders 21 in the rinse bath 2, the time required for transporting the wafers 15 from the rinse bath 2 to the organic vapor drier 3 can be greatly reduced. Therefore, the generation of water marks or the like can be prevented after the wafers 15 are dried in the organic vapor driver 3. Additionally, in transferring the wafers 15 from the carrier 14 to the holders 21, the carrier 14 and the holders 21 are lowered together to lift the wafers 15 by means of the push-up table 18. That is, the wafers 15 can be transferred without the need of vertically moving the push-up table 18, thereby preventing contamination of the liquid in the rinse bath 2.

Although the transporter 16 is constructed of the lift 10, the lift arm 11 and the carrier mounting member 12 in the preferred embodiment, any suitable transporter may be used according to the present invention. Although the wafer holding device 23 is constructed of the moving member 19, the holder arms 20 and the holders 21 in the preferred embodiment, any other wafer holding device may be used according to the present invention. Although the push-up table 18 is fixedly provided in the rinse bath 2 in the preferred embodiment, it may be vertically movably pivoted in the rinse bath 2.

In summary, according to the present invention, as the wafers are quickly dried by the vapor of the organic solvent without using the carrier, the generation of stains, such as water mark is avoided and the quantity of the organic solvent to be consumed in the vapor drier is reduced, resulting in advantages of economy and safety. Further, energy consumption of the heater in the vapor drier can also be reduced to improve the economy. Moreover, even when the liquid chemical in the cleaning bath is deposited on or penetrates into the carrier, it is prevented from being attached to the wafers during the drying step, thereby avoiding the generation of water marks on the wafers. Thus, the present invention has all of the various advantages mentioned above.

While the invention has been described with reference to specific embodiments, the description is illustrative only and is not to be constructed as limiting the scope of the invention. Various modifications and changes may occur to those skilled in the art without departing from the spirit and scope of the invention as defined by the appended claims.

What is claimed is:

1. In a wafer washing and drying apparatus including a chemical cleaning bath for cleaning a wafer set in a carrier with a liquid chemical reserved therein, a rinse bath for washing off said liquid chemical attached to said water with a washing liquid reserved therein, and an organic vapor drier for drying said wafer in contact with a vapor flow of an organic solvent, the improvement comprising a wafer holding device having a holder for holding said wafer upon transfer from said carrier, said holder having a heat capacity smaller than that of said carrier, said wafer holding device having a function of transporting said wafer from said rinse bath to said organic vapor drier and wafer transferring means for transferring said wafer from said carrier to said holder in said rinse bath.

2. The wafer washing and drying apparatus as defined in claim 1, wherein said liquid chemical reserved in said chemical cleaning bath comprises an acid or alkali solution.

3. The wafer washing and drying apparatus as defined in claim 1, wherein said wash liquid reserved in said rinse bath comprises pure water or an organic solvent.

* * * * *